(12) United States Patent
Daga et al.

(10) Patent No.: US 7,271,634 B1
(45) Date of Patent: Sep. 18, 2007

(54) DELAY-LOCKED LOOP HAVING A PLURALITY OF LOCK MODES

(75) Inventors: Anand Daga, San Jose, CA (US);
Sanjay Sethi, San Jose, CA (US);
Philip E. Madrid, Round Rock, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 11/286,454

(22) Filed: Nov. 23, 2005

Related U.S. Application Data (60) Provisional application No. 60/718,014, filed on Sep. 16, 2005.

(51) Int. Cl.
*H03L 7/06* (2006.01)
(52) U.S. Cl. ..................... 327/149; 327/158
(58) Field of Classification Search ............... 327/149, 327/158, 153, 160, 161, 162, 163; 331/17, 331/25, DIG. 2; 375/373–376
See application file for complete search history.

(56) References Cited

U.S. PATENT DOCUMENTS

| | | | |
|---|---|---|---|
| 6,337,590 B1 | 1/2002 | Millar | 327/158 |
| 6,496,048 B1 | 12/2002 | Sikkink | 327/277 |
| 6,670,835 B2 | 12/2003 | Yoo | 327/158 |
| 2003/0199262 A1 | 10/2003 | Chung | 455/265 |
| 2004/0125905 A1* | 7/2004 | Vlasenko et al. | 375/376 |

OTHER PUBLICATIONS

U.S. Appl. No. 11/327,572, filed Jan. 6, 2006, entitled: "Delay Line Periodically Operated in a Closed Loop," naming inventor Anand Daga.
U.S. Appl. No. 11/240,231, filed Sep. 30, 2005, entitled: "Voltage Controlled Delay Line (VCDL) Having Embedded Multiplexer and Interpolation Functions," naming inventors Rohit Kumar and Anand Daga.
Garlepp, Bruno W., et al., "A Portable Digital DLL for High-Speed CMOS Interface Circuits," IEEE Journal of Solid-State Circuits, vol. 34, No. 5, May 1999, pp. 632-644.
Maneatis, John G., "Low-Jitter Process-Independent DLL and PLL Based on Self-Biased Techniques," IEEE Journal of Solid-State Circuits, vol. 31, No. 11, Nov. 1996, pp. 1723-1732.
Sidiropoulos, Stafanos and Horowitz, Mark A., "A Semidigital Dual Delay-Locked Loop," IEEE Journal of Solid-State Circuits, vol. 32, No. 11, Nov. 1997, pp. 1683-1692.

* cited by examiner

*Primary Examiner*—Linh My Nguyen
(74) *Attorney, Agent, or Firm*—Zagorin O'Brien Graham LLP (57) ABSTRACT

A delay-locked loop (DLL) has a counter that is incremented or decremented by the loop in the process of achieving lock. The counter value is converted using an digital to analog converter (DAC) to an analog voltage that controls the delay through the delay line. During faster lock modes, the loop increments/decrements intermediate bits of the counter (with the bits less significant being held at a constant value, e.g., 0) to provide a coarse lock, rather than incrementing/ decrementing the least significant bit of the counter. After coarse lock is achieved, a better lock is then achieved by incrementing/decrementing the counter using a smaller increment, i.e., a less significant bit is updated, until finally, the LSB is utilized to achieve fine lock. Utilizing the coarse lock first, and then one or more finer locks, allows the lock to be achieved more quickly.

22 Claims, 10 Drawing Sheets

| Counter Code | 00 00 | 00 01 | 00 10 | 00 11 | 01 00 | 01 01 | 01 10 | 01 11 | 10 00 | 10 01 | 10 10 | 10 11 | 11 00 | 11 01 | 11 10 | 11 11 |
|---|---|---|---|---|---|---|---|---|---|---|---|---|---|---|---|---|
| Switch Code | 1a | 1b | 1c | 1d | 2a | 2b | 2c | 2d | 3a | 3b | 3c | 3d | 4a | 4b | 4c | 4d |

| 604a | 604b | 604c | 605a | 605b | 605c | 606a | 606b | 606c | Total Delay |
|------|------|------|------|------|------|------|------|------|-------------|
| 1 | 0 | 0 | 0 | 0 | 0 | 0 | 0 | 0 | 1.0*Δ |
| 1 | 1 | 0 | 0 | 0 | 0 | 0 | 0 | 0 | 1.5*Δ |
| 0 | 1 | 0 | 0 | 0 | 0 | 0 | 0 | 0 | 2.0*Δ |
| 0 | 1 | 1 | 1 | 0 | 0 | 0 | 0 | 0 | 2.5*Δ |
| 0 | 0 | 1 | 1 | 0 | 0 | 0 | 0 | 0 | 3.0*Δ |
| 0 | 0 | 1 | 1 | 1 | 0 | 0 | 0 | 0 | 3.5*Δ |
| 0 | 0 | 1 | 0 | 1 | 0 | 0 | 0 | 0 | 4.0*Δ |

| 1a | 1b | 1c | 1d | 2a | 2b | 2c | 2d | Total Delay |
|----|----|----|----|----|----|----|----|-------------|
| 1 | 1 | 1 | 1 | 0 | 0 | 0 | 0 | Phase1 + Δ |
| 1 | 1 | 1 | 0 | 0 | 0 | 0 | 1 | Phase1 + Δ + (x/4) |
| 1 | 1 | 0 | 0 | 0 | 0 | 1 | 1 | Phase1 + Δ + (2x/4) |
| 1 | 0 | 0 | 0 | 0 | 1 | 1 | 1 | Phase1 + Δ + (3x/4) |
| 0 | 0 | 0 | 0 | 1 | 1 | 1 | 1 | Phase2 + Δ |

DELAY-LOCKED LOOP HAVING A PLURALITY OF LOCK MODES

CROSS-REFERENCE TO RELATED APPLICATION(S)

This application claims the benefit under 35 U.S.C. § 119(e) of application No. 60/718,014, filed Sep. 16, 2005, which application is incorporated herein by reference.

BACKGROUND

1. Field of the Invention

This application is directed to delay-locked loops.

2. Description of the Related Art

High speed memory interfaces employ delay lines to position data with respect to clock or clocks with respect to data to meet system timing requirements. A delay line typically includes a series of delay cells, where the delay through each cell can be varied. Delay lines can be configured in a delay-locked loop (DLL), which automatically adjusts the voltage/current in the delay cell, so that the total delay of the delay line tracks the frequency of a reference signal supplied to the DLL. When the delay line supplies an output signal having the desired frequency and phase, the DLL is said to be locked.

High accuracy may be required for high speed memory interfaces. In typical computer systems, low power modes are used to save power and/or adjust operation of the computer to system processing and power requirements. In some prior art solutions, a DLL is provided for a number of delay lines and the control voltage/current that determines the delay of the delays cells is also applied to the delay cells of the associated delay lines. When a DRAM controller utilizing a delay line to position data and/or clocks enters a low power mode, the control voltage/current that determines the delay line delay must be frozen in place, as the DLL loses the reference clock. However, a frozen DLL cannot continue to compensate for temperature variations. If the memory controller is in a low power state for a long time, the temperature can change significantly and the DLL effectively loses lock. In addition, in some power states, the clock frequency can be changed either up or down to accommodate system requirements. For example, when a processor is being lightly utilized, the clock speed may be reduced to save power. The delay line effectively loses lock if the reference clock changes frequency.

Normally the time available to achieve lock is large, e.g., on the order of 100 microseconds. However, the clock utilized as the reference clock for the memory interface can change frequency by as much as 2×. That change occurs while the chip (DRAM) is in self-refresh mode. After any such change, the DLL needs to relock to the new frequency quickly, e.g., in about 2 microseconds, without sacrificing accuracy. Some modes require the memory controller to enter and exit quite rapidly so that main memory is not taken offline for too long. Specifically, some systems with Unified Memory Architecture (UMA) have maximum isochronous latency requirements that would be violated waiting for the DLL to re-achieve lock in the absence of a faster lock time. In these systems the DLL is required to lock in about 2 microseconds.

SUMMARY

Accordingly, it would be desirable to provide a DLL having a faster lock time (e.g., on the order of 50 to 100 times faster than in regular lock mode) in those situations in which a faster lock time is demanded by system requirements. In an embodiment, a DLL is utilized that has a counter that is incremented or decremented by the loop in the process of achieving lock. The counter value is converted using an digital to analog converter (DAC) to an analog voltage that controls the delay through the delay line. During faster lock modes, the loop increments/decrements intermediate bits of the counter (with the bits less significant being held at a constant value, e.g., 0) to provide a coarse lock, rather than incrementing/decrementing the least significant bit of the counter. After coarse lock is achieved, a better lock is then achieved by incrementing/decrementing the counter using a smaller increment, i.e., a less significant bit is updated, until finally, the LSB is utilized to achieve fine lock. Utilizing the coarse lock first, and then one or more finer locks, allows the lock to be achieved more quickly. However, that approach may result in false locks that need to be guarded against. The choice to use one or more faster lock modes as opposed to the slowest lock mode (by incrementing or decrementing the LSB) is programmable.

In one embodiment a method is provided for operating a delay line. The method includes determining a count value in a counter according to a comparison of a reference signal supplied to the delay line and a feedback signal generated by the delay line. The method may further include determining a count increment for the counter according to a selected one of a plurality of lock modes, at least one of the lock modes being a fast lock mode causing the counter to count in increments initially during locking equal to a value of one of the intermediate bits of the counter and another of the lock modes causing the counter to count in increments initially during locking equal to the least significant bit of the counter.

In another embodiment a delay-locked loop circuit is provided that includes a delay line circuit having a controllable delay. A phase detector circuit is coupled to compare a reference signal with a feedback signal of the delay-locked loop circuit and supply one or more signals indicative of the comparison. A counter circuit is coupled to the one or more signals from the phase detector circuit. An initial increment value for the counter while locking to the reference signal varies according to which lock mode of a plurality of lock modes is selected.

BRIEF DESCRIPTION OF THE DRAWINGS

The present invention may be better understood, and its numerous objects, features, and advantages made apparent to those skilled in the art by referencing the accompanying drawings.

DESCRIPTION OF THE PREFERRED EMBODIMENT(S)

A delay-locked loop (DLL) can be used to create an arbitrary phase delay with respect to a reference clock and can compensate for process, voltage, and temperature (PVT) variations in integrated circuits. In high speed interfaces, e.g., the DDR2 memory interface, a robust delay-locked loop (DLL) having low jitter and offset is important for both receive and transmit timing. In an embodiment, the DDR2 interface requires digitally programmable phase delays of clock-period*N/64 of a reference clock, where N in an integer and could be anywhere from 1 to 64

Figure 1A:
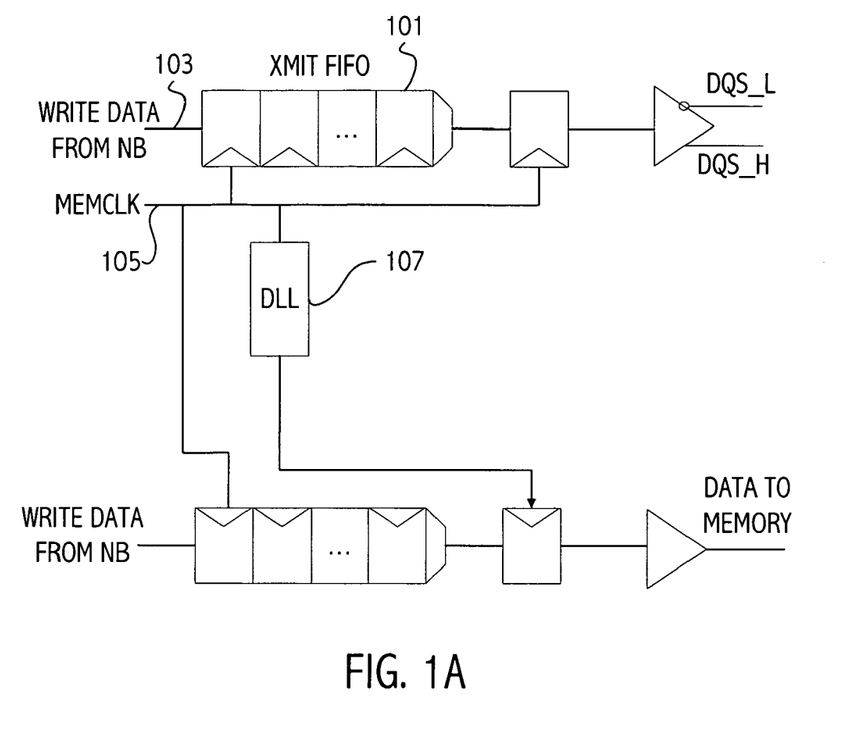
FIG. 1A illustrates a high level diagram of an exemplary memory interface in which an embodiment of the invention can be utilized.

Referring to FIG. 1A, an exemplary memory interface is shown in which an embodiment of the invention can be utilized. Outbound data is written into a transmit FIFO 101 using a source synchronous data path 103. In one embodiment the MEMCLK 105 is used as the reference clock for all outbound signals. In some embodiments a portion of the memory interface is located in a separate voltage plane from other portions of the integrated circuit, e.g., in an input/output (I/O) region, and level shifting circuits (not shown) may be required for both clocks and data to translate from one voltage region to another. In the illustrated embodiment, the DLL 107 is used to delay data being supplied to the memory with respect to the strobe DQS also being supplied to the memory. The data in FIG. 1A is supplied from the North Bridge (NB), a traditional portion of PC architecture that provides memory control functions, which may be incorporated into the processor integrated circuit.

Figure 1B:
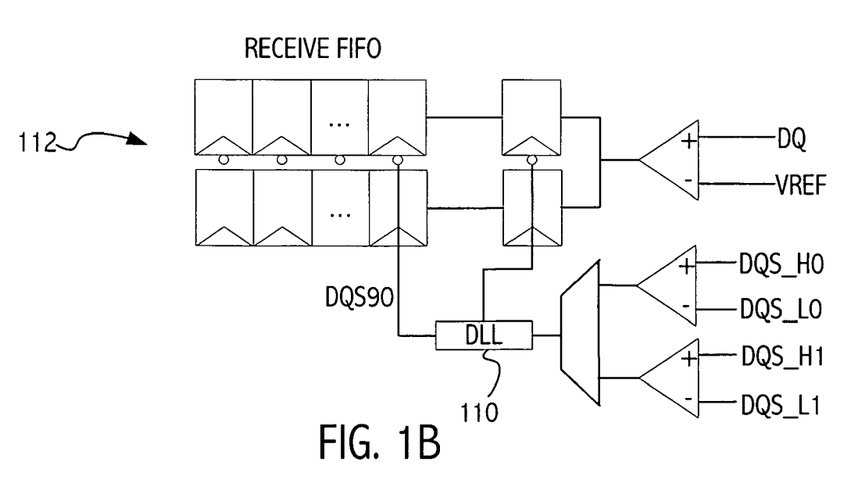
FIG. 1B illustrates a receive portion of the memory interface.

FIG. 1B illustrates a receive portion of the memory interface in which the DQS strobes are supplied through DLL 110, which are used to clock the data into the receive FIFO 112.

According to an embodiment of invention, the DLL provides multiple equally spaced phases which are PVT compensated. In some embodiments, depending on the application, the DLL provides either 32 or 48 equally spaced phases. Due to range restrictions, all the 64 phases may not be used in the delay line in some embodiments. In one embodiment, the delay line architecture includes a 16 stage voltage controlled delay line which provides natural clock division into 64 equal parts using a 16:1 multiplexer and a 4 bit phase interpolator, both of which are incorporated into the delay line. Note that the loop around the delay line is digital because the delay line in the DLL passes a signal in open loop. Under those conditions, the control voltage has to be maintained at its lock value for an indefinite period of time.

Figure 2:
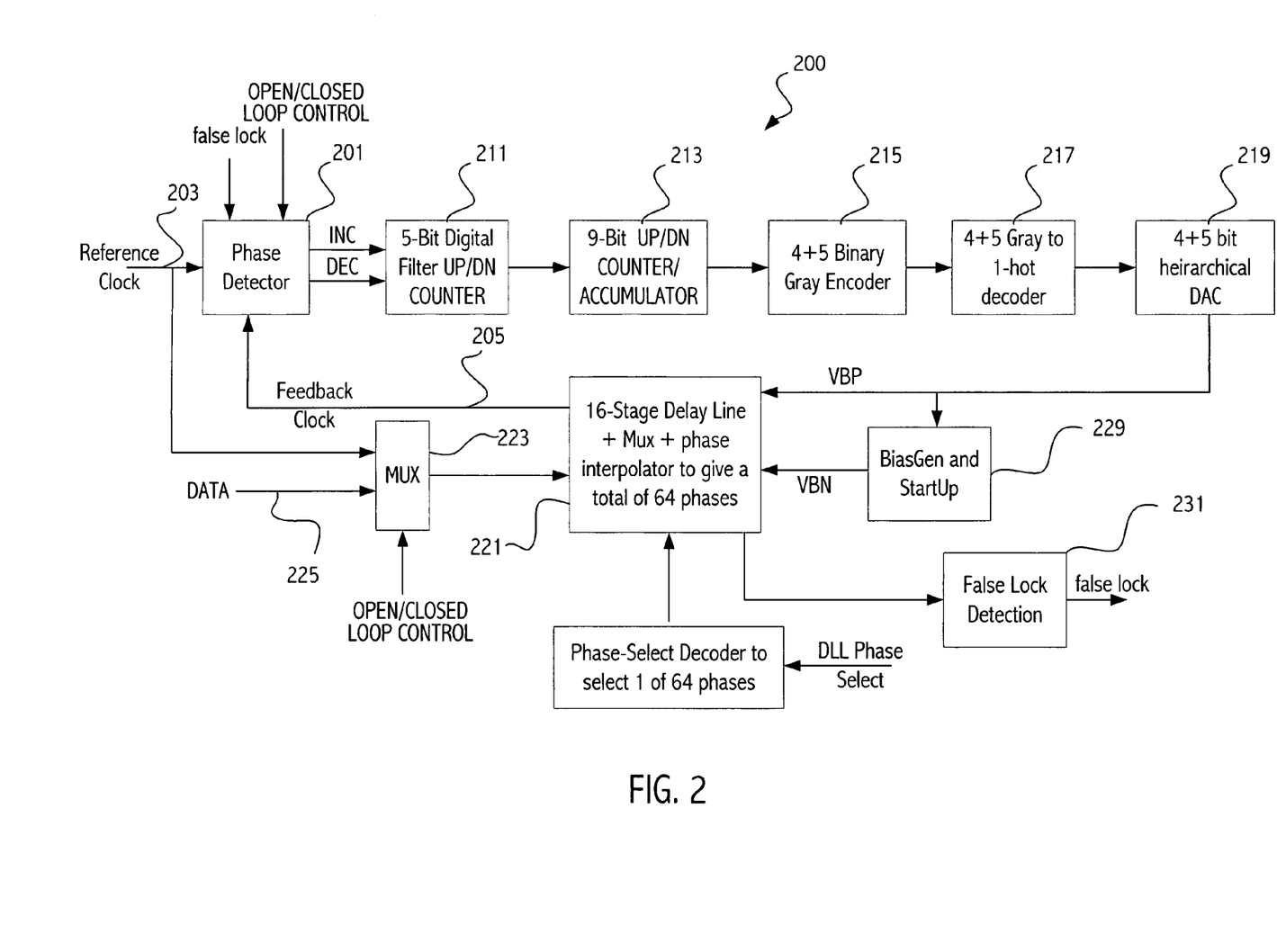
FIG. 2 illustrates a block diagram of a DLL according to an embodiment of the invention.
Figure 3:
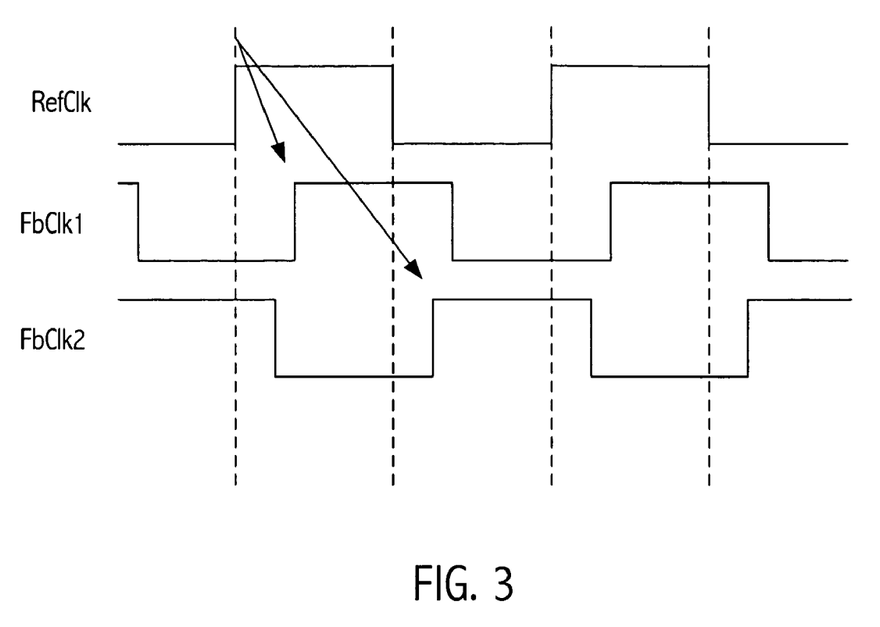
FIG. 3 illustrates the relationship between the reference clock and the feedback clock in the DLL.

A block diagram of an exemplary DLL 200 according to an embodiment of the invention is shown in FIG. 2. The DLL 200 includes a phase detector 201. The phase detector is used to achieve a 180 degree lock to the reference clock 203. It is clocked by the falling edge of reference clock 203. The operation of the phase detector is shown in FIG. 3, which illustrates the relationship between the reference clock 203 (RefClk) and the feedback clock 205 (FbClk) as the phase detector attempts to lock. In FIG. 3, Fbclk1 is an example of the feedback clock 205 (FIG. 2) delayed less than 180 degrees, while FbClk2 is an example of the feedback clock 205 (FIG. 2) delayed greater than 180 degrees. The phase detector output is supplied to a counter 211, which acts as a filter, which in turns supplies the counter accumulator 213. When the falling edge of the reference clock is received at phase detector 201, if the feedback clock 205 is high, that indicates that the delay should increased, and if the feedback clock is low, then the delay should be decreased.

In an embodiment, the phase detector is a series of two flip-flops followed by a monotonic flip-flop having two outputs, followed by a decision logic block. The decision logic block modifies the monotonic outputs, conditioning them with open/closed loop control and false-lock detect signal before sending them to the filter 211. In an embodiment, the phase detector provides two outputs, INC and DEC. When INC goes high, the counter increments. When DEC goes high, the counter decrements. Three states are needed as outputs from the phase detector: (1) increment; (2) decrement; and (3) do nothing. A monotonic flip-flop naturally provides these three states, since the precharged state corresponds to 00 state. 00 is the "do nothing" state. In an embodiment, the counter is a master-slave style counter. In the 00 state, the master latch does not accept any inputs. It passes its value to the slave latch. Since the master latch outputs control the downstream logic, all succeeding logic does not get updated in that state.

In an embodiment, the phase detector is designed so that the DLL locks to 180 degrees, and the delay line starts from its fastest setting. The fastest setting corresponds to all zeros in the DAC counter 213. During the initialization process, after power is determined to be satisfactory, BIOS determines the correct MEMCLK frequency by communicating with the DRAM. The DLL starts the locking process after the chip comes out of reset and a control signal causing the DLL to remain frozen is deasserted.

In some embodiments, the data needs to be resolved completely before it reaches the monotonic flip-flop. Two flip-flops before the monotonic are sufficient for resolving the data. When the DLL is locked, the feedback clock may consistently violate setup/hold time requirements. However, the DLL is not in lock mode all the time. In an embodiment, when the chip powers up, the DLL is in lock mode for approximately 200 microseconds and then goes open loop. The loop is periodically closed (e.g., about every 1 ms or 5 ms) to allow the DLL to compensate for temperature variations. The time period may be programmable. For example, a programmable location may select between 1 ms and 5 ms. When the loop is open the conditioning logic block in the phase detector forces the INC and DEC outputs to 0, preventing the counter from changing.

The output of the phase detector 201 is supplied to a filter 211. The filter essentially maintains a running count of INC/DEC signals from phase detector 201 using a 5-bit up down counter. Every fast signal decrements the count by one and every slow signals increments the count by one. An overflow beyond 32 or underflow beyond 0 resets the counter back to 16. That ensures that the accumulator does not jitter back and forth, which it would do if the overflow and the underflow toggled the filter between the same two numbers. Thus, the filter 211 functions as a 16-cycle filter before the accumulator 213. The accumulator 213 gets updated once for each filter overflow or underflow.

The filter provides two functions. First it filters out input reference clock jitter, power supply noise and other random events. Secondly, the filter gives enough time so that any change made to the DAC setting actually affects the delay through the delay line before the next change is made. The size of the filter depends upon the particular application and provides stability for the DLL.

In one embodiment, illustrated in FIG. 2, the accumulator 213 is a saturating 9-bit accumulator. The upper 4 bits control the main DAC whereas the lower 5-bits control the sub DAC. In an embodiment, the accumulator is 9-bit to ensure that the delay line is sufficiently accurate. Other accumulator sizes are of course possible depending on the particular application. However, this is a binary counter and the various bits update at different times. Therefore, the bits are first converted to a binary-reflected gray code in gray encoder 215, then stored. Then they are decoded using a one-hot decoder 217. Even then, the possibilities of code going between intermediate states exist since that is the nature of a one-hot decoder. However, if everything is matched, any such glitch should be small in duration and not significantly affect the DAC.

The effect of the decoder output changing before settling to a final value may be limited because the switches are CMOS switches. Therefore the two gate inputs switch in opposite directions. One injects charge and the other takes it away. There is still net charge injected or taken away since the overlap capacitance on NMOS and PMOS are not the same.

Figure 4A:
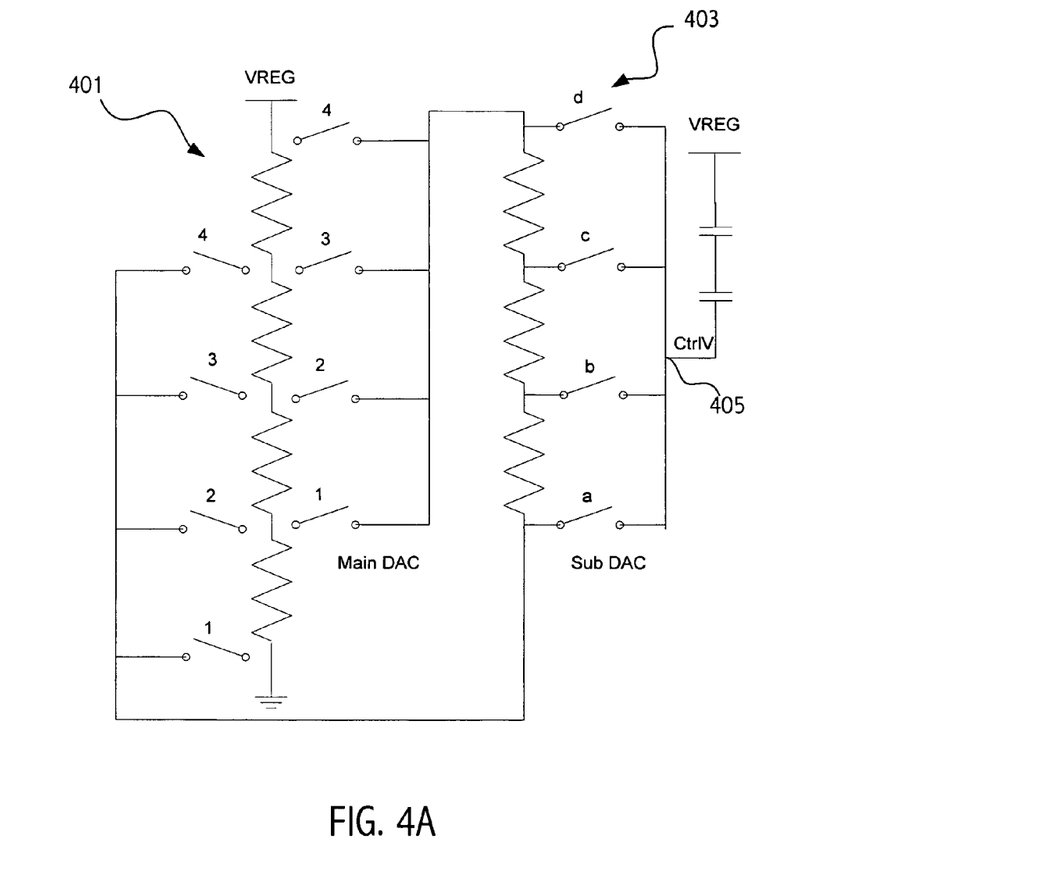
FIG. 4A illustrates an exemplary DAC structure.

The digital to analog converter 219 converts the accumulator digital count into a control voltage, which directly controls the delay line 221 through the bias voltages VBN and VBP. In an embodiment VBN is supplied by a bias generator and startup circuit 229. In an embodiment, the DAC is implemented as a hierarchical R ladder, having a 16 resistor (4 bits) first stage and a 31 resistor (5 bits) second stage. FIG. 4A illustrates the DAC architecture. FIG. 4A is a simplified diagram showing only 4 resistors as the first stage and 3 resistors as the second stage to facilitate understanding. Operation of the DAC in FIG. 4A is illustrated in conjunction with the table shown in FIG. 4B. For purposes of this example, assume a four bit counter is supplying the counter values. The upper two bits select the resistor in the main DAC 401 and the lower two bits select the resistor in the sub-DAC 403.

Figure 4B:
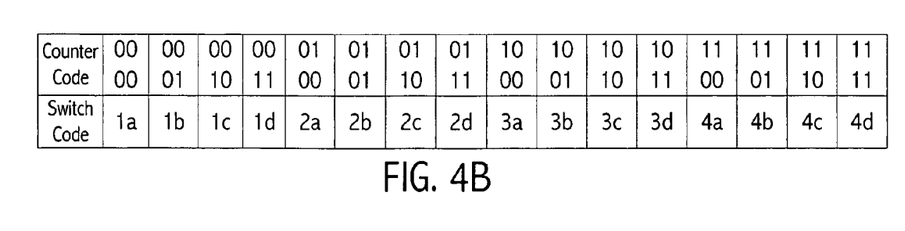
FIG. 4B illustrates operation of the DAC by showing the relationship between a counter value and operation of the switches shown in FIG. 4A.

Referring to FIGS. 4A and 4B, when the counter code is 0001 the switch code is 1b. That causes the two switches labeled 1 to close and the one switch labeled b to close. When the counter code is 0010, the switch code is 1c. That causes the two switches labeled 1 to close and the one switch labeled c to close. The table illustrated in FIG. 4B details the switch settings for the 16 possible codes.

Figure 5:
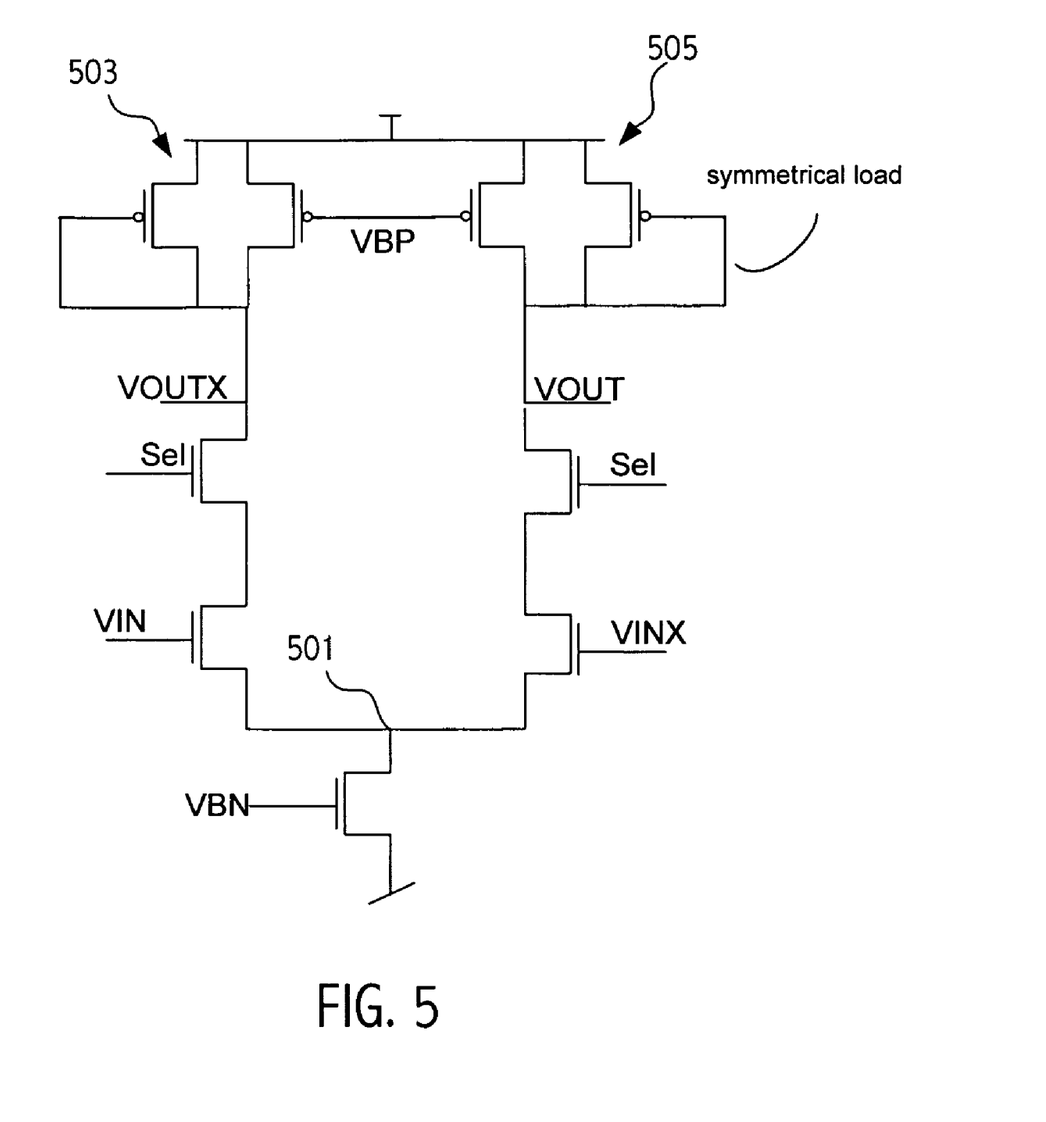
FIG. 5 illustrates an exemplary delay cell.

The outputs of the DAC 219 are used to control the delay through the delay cell. FIG. 5 illustrates an embodiment of a differential delay cell, which provides good delay range and duty cycle performance, at the cost of higher dc power.

In an embodiment, all devices are body-tied (source tied to body region under the channel) to alleviate the effects of hysteresis. The width of the devices should be chosen to balance hysteresis and appropriate phase blending on one hand, and to minimize mismatch and meet required delay range on the other hand. In one embodiment, the channel length is 2.5L, where L is a technology dependent unit. Even though higher length would reduce mismatch between the various delay cells, it also means higher power. Since there may be multiple functional DLLs in a particular embodiment, power may be a primary concern. In such embodiments, the channel width and length should be chosen to satisfy the DLL range requirements and to utilize the minimum power possible.

An embodiment may require that the DLL provide 32 different phases of the reference clock MEMCLK. That is the granularity should be MEMCLK/64, since the DLL locks to 180 degrees of MEMCLK. The DLL may provide 32 equally spaced phases, nominally separated by 40 ps for an application such as DDR-800. But that does not take into account any non-linearities and mismatches, which may increase the requirement for the number of phases, to, e.g., 48 phases.

In an embodiment in which the DLL is used in a DDR interface, they may be tens of DLLs in the interface. Therefore it is desirable to keep the power consumption of the DLL low. A voltage controlled delay line (VCDL) may require a voltage regulator if voltage supplies are too noisy and create too much jitter.

In the illustrated embodiment, the signal through the DLL switches between a closed loop mode in which a reference clock signal is supplied to the DLL and the DLL is being locked to that reference clock and an open loop mode in which another aperiodic signal is passing through the delay line. Referring to FIG. 2, a multiplexer 223 selects between the reference clock and a data signal (i.e., an aperiodic signal) 225 according to whether the delay line 221 is operating in open loop or closed loop mode. As described further herein, the multiplexer 223 may be incorporated into the first stage of the delay line. Referring again to FIG. 1B, the aperiodic signal may be, e.g., the DQS signals received from the memory interface. The aperiodic signal 225 can last for a long time (several microseconds). When the aperiodic signal is going through the delay line, the DLL is in open loop. This is acceptable because the DLL has already compensated for process, the delay line runs off a regulated supply, and the temperature time constants are too large (in the millisecond range) for the temperature to change significantly in a few microseconds. However, since the signal passing through the delay line could be an aperiodic signal, to reduce hysteresis, all devices in the delay line should be body-tied according to one embodiment of the delay line.

In order to provide the ability to select phases a multiplexer and phase interpolator (PI) can be placed after the delay line to select the appropriate phase or phases and interpolate between them. However, if the multiplexer and PI are after the delay line, the multiplexer and interpolator create an uncalibrated delay that varies with PVT. That may be undesirable in certain DLL applications.

Referring again to FIG. 1A, in the transmit data path, the DLL is used to delay the clock signal that sends the data out. In an embodiment of the DDR interface, the data is received at the interface for transmission a logical half-cycle early.

The delay in transmitting (or launching) the data ensures that the DQS is centered in the data eye. In the RX data path (FIG. 1B), the incoming strobe DQS is delayed so that its edge falls in the center of the data eye. In the Address path (not shown), the DLL is used to delay the clock signal, that sends the control signals out. In the RcvEn path (not shown), the DLL is used to delay the Receiver Enable that comes from the NB.

The uncalibrated delay created by the multiplexer+PI if placed after the delay line can be significant (on the order of 100s of ps), and can play havoc with any timing budget. Either the uncalibrated delay needs to be matched in corresponding other paths or it needs to be calibrated out. If this delay is not matched in other corresponding paths, it creates a minimum delay that the signal passing through that path experiences. If it is calibrated out, apart from the uncertainties inherent in the calibration scheme, a dead zone corresponding to that delay gets created in the multiplexer settings. The other option is to match the delay in the corresponding other paths but that could negatively affect the timing budget as well as create unwanted noise and jitter.

Figure 6A:
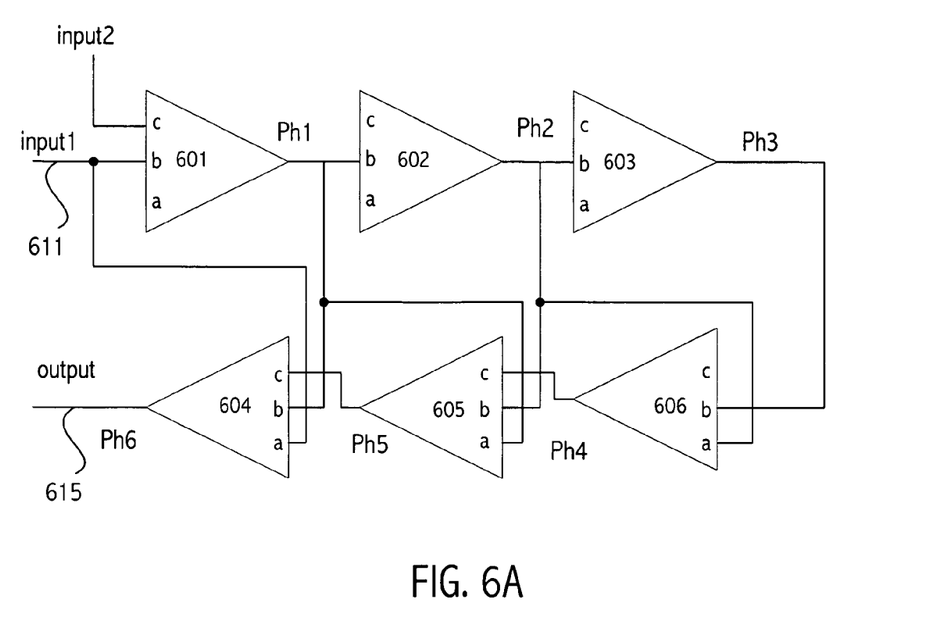
FIG. 6A illustrates operation of the delay line architecture that includes a phase interpolator and multiplexer in the delay cells.

Thus, in an embodiment, the multiplexer and phase interpolator form an integral part of the delay line itself to avoid the above-mentioned problems. FIG. 6A is a high level diagram illustrating operation of an embodiment of the delay line with integrated multiplexing and phase interpolation. FIG. 6A shows 6 delay cells 601-606. Each delay cell includes three switches a, b, and c. To simplify the diagram and the explanation of the operation of the multiplexing and phase interpolation some of the switches are shown without connection. FIG. 6A illustrates how the multiplexer and phase interpolator is integrated into the delay cell. There is a multiplexer on the output, delay cell 604, which can select the input signal 611, thus bypassing the rest of the delay line completely. There is also a multiplexer on the input delay cell 601 that corresponds to the multiplexer 223 shown in FIG. 2. Appropriate selection of the switches 601b and 601c select between the reference clock and the aperiodic signal on input2. Note that a an embodiment includes a multiplexer (not shown in FIG. 6A) after the last delay cell that can be used by the data signal to bypass the delay line completely.

Figure 6B:
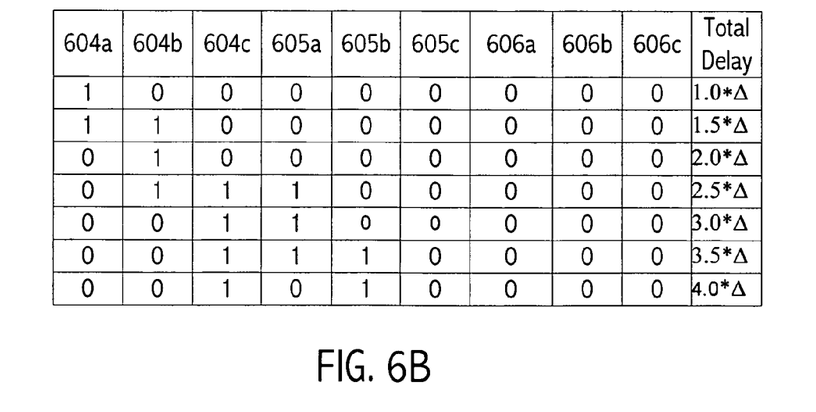
FIG. 6B illustrates how the switches in FIG. 6A are used to generate delay in the delay.
Figure 6C:
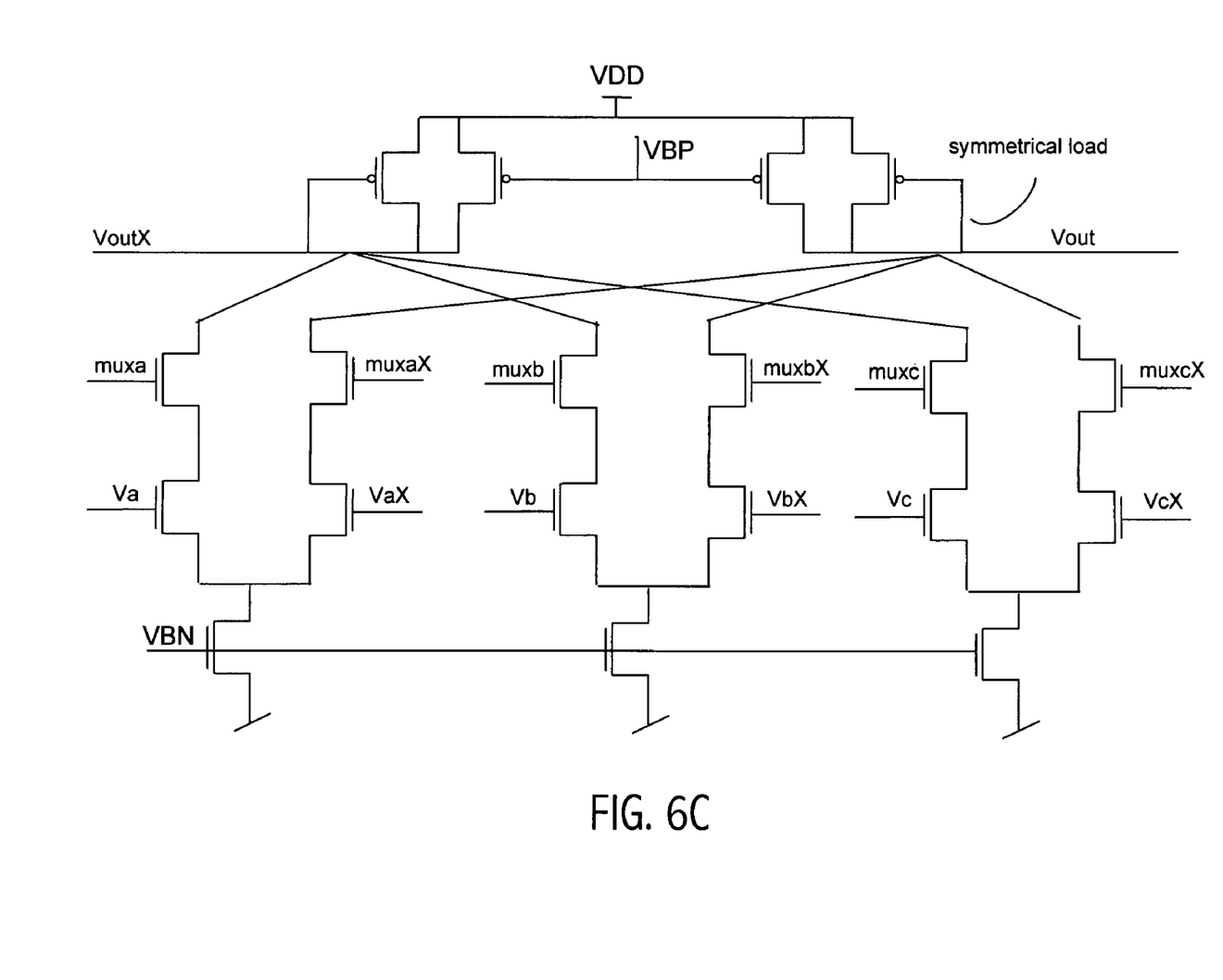
FIG. 6C illustrates an embodiment of a delay cell shown in FIG. 6A.

FIG. 6B illustrates the operation of the delay cell. Assume the delay cell delay is Δ. The minimum delay through the delay line is 1 delay cell or Δ. When switch 604(a) in delay cell 604 is closed (i.e. the path is selected), the input on node 611 is supplied to the output 615. The total delay is 1*Δ (the delay of delay cell 604). When switches 604(a) and 604(b) are closed, delay stage 604 interpolates between the input signal and the output of stage 601, generating a total delay of 1.5*Δ. When only switch 606(b) is closed, a total delay of 2*Δ is generated. When switches 604(b), 604(c), and 605(a) are closed, the total delay is 2.5*Δ. FIG. 6B illustrate the switch setting appropriate to achieve delays between 1*Δ and 4*Δ. FIG. 6C illustrates an embodiment of a delay cell shown in FIG. 6A.

Figure 7:
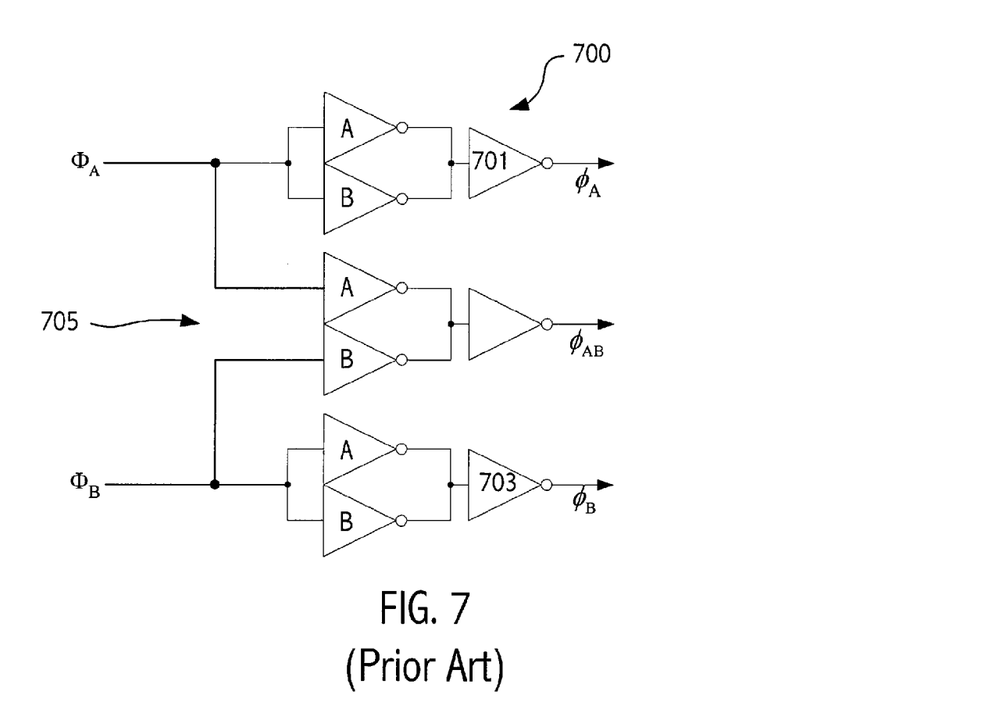
FIG. 7 illustrates an exemplary block diagram of a phase interpolator.

In order to accomplish the phase interpolation assumed in FIGS. 6A and 6B, a circuit is required to blend two (or more) signals to create a third signal that is between the two. An exemplary simple, single-stage phase-blender circuit 700 is shown in the FIG. 7. This circuit receives two phase-adjacent input signals, $\Phi_A$ and $\Phi_B$, which are separated in phase by one inverter delay. The phase blender directly passes these two signals with a simple delay to produce output signals $\phi_A$ and $\phi_B$ in inverters 701 and 703. The phase blender circuit uses a pair of phase-blending inverters 705 to interpolate between these two input signals to produce a third output signal, $\phi_{AB}$, having a phase between that of $\phi_A$ and $\phi_B$. That effectively doubles the available phase resolution. However, it is not sufficient to use equal-sized inverters for the phase blending.

Figure 8:
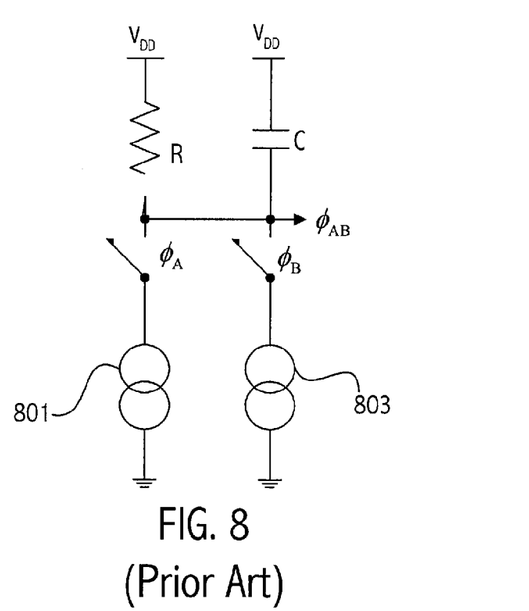
FIG. 8 illustrates operation of a phase interpolator.

FIG. 8 illustrates a simple model useful for understanding operation of the phase blending circuits and that relative sizes of the two phase-blending inverters determine where the phase of $\phi_{AB}$ lies between that of $\phi_A$ and $\phi_B$. The model approximates the two inverters with two simple switched current sources 801 and 803 sharing a common resistance capacitance (RC) load.

Figure 9A:
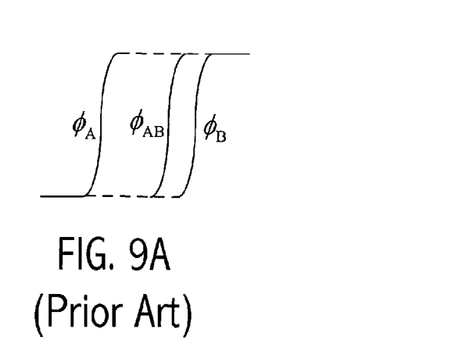
FIG. 9A illustrates a possible output of the phase interpolator.
Figure 9B:
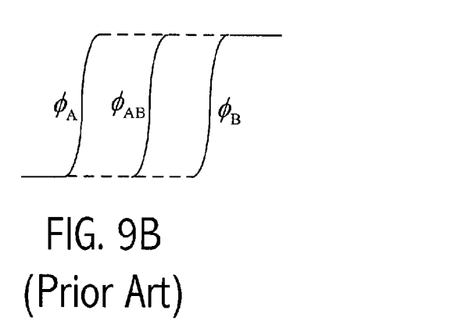
FIG. 9B illustrates a possible output of the phase interpolator.

For input signals separated in phase by one inverter delay, in order to ensure that the phase of $\phi_{AB}$ lies directly in between that of $\phi_A$ and $\phi_B$, the phase-blending inverters should be sized appropriately. In an embodiment, the phase blending inverters are sized in a ratio w=60/(60+40)=0.6, such that the leading phase is coupled to an inverter that is bigger than the one that receives the lagging phase and the blended phase lies halfway between $\phi_A$ and $\phi_B$, where w=$W_A$/($W_A$+$W_B$)=where $W_A$ is the width of the transistors forming inverter A and $W_B$ is the width of the transistors forming the inverter B. FIGS. 9A and 9B illustrate the effect of the relative sizing of the phase blending inverters. The phase of output signal is closer to that of $\phi_B$ than to that of $\phi_A$ when the phase-blending inverter size ratio is w=0.5 as shown in FIG. 9A. FIG. 9B shows $\phi_{AB}$ is half way between $\phi_A$ and $\phi_B$ when phase blending inverters are sized in a ratio w=60/(60+40)=0.6, and the leading phase is coupled to the inverter that is bigger than the inverter that receives the lagging phase. Reversing the phase of these two input signals would result in $\phi_{AB}$ being displaced because the effective sizing ratio would then be w=0.4. Note also that all paths through the circuit should provide the same loading and delay to ensure that the phase relationship between $\Phi_A$ and $\Phi_B$ is maintained by $\phi_A$ and $\phi_B$.

The phase-blender idea can be extended to multiple cascaded stages for further phase-resolution improvement, with each additional stage improving the resolution by a factor of two. Although it is theoretically possible to increase phase resolution indefinitely by adding more and more phase-blender stages, there is a practical limit. The number of inverters in each signal path increases by two with each additional phase-blending stage, making the circuit increasingly susceptible to voltage supply noise-induced jitter due to the additional delay in the signal path. Therefore, it is prudent to increase the number of blending stages to improve phase resolution only until the output phase step size from the phase blender is approximately equivalent to the anticipated voltage supply noise-induced jitter. There are several design limitations that should be considered when designing a cascaded phase blender. First, the importance of proper (asymmetrical) sizing of the phase-blending inverters grows with the number of cascaded blending stages because edge misplacement has a compounding effect as the signals travel through the multiple stages. Additionally, close attention should be paid to ensuring equal loading for equal delay through all paths, requiring the use of dummy devices on otherwise unbalanced paths. Finally, like a single-stage phase blender, a cascaded phase blender also requires the phase of $\Phi_A$ to lead that of $\Phi_B$ to ensure even output phase spacing.

Figure 10:
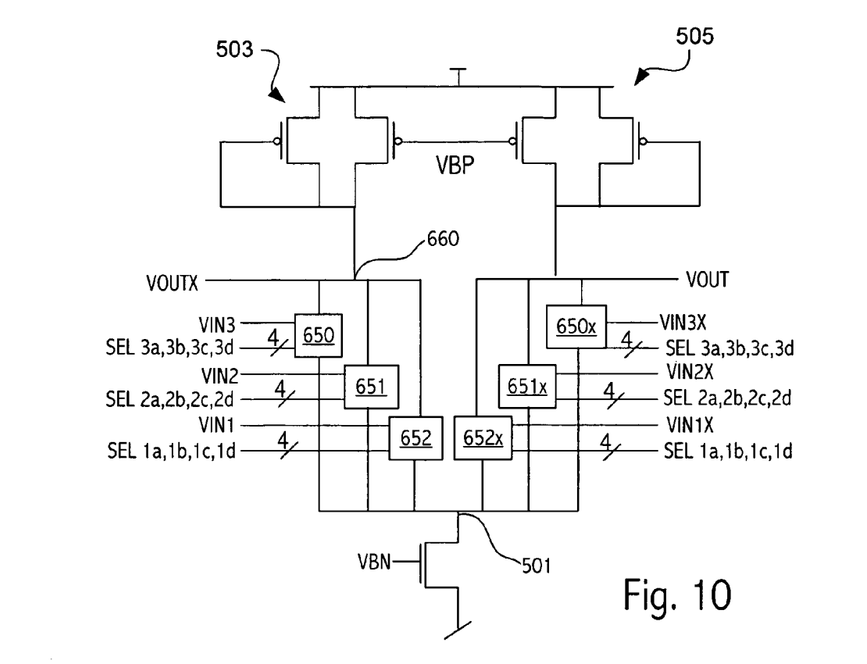
FIG. 10 illustrates an embodiment of a delay cell according to an embodiment of the invention.
Figure 11:
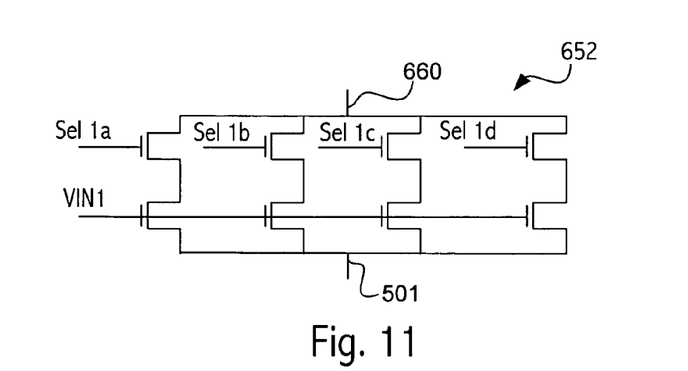
FIG. 11 illustrates additional details of the embodiment illustrated in FIG. 10.

In order to achieve the phase blending and multiplexing operation described in FIGS. 6A and 6B, an embodiment of the invention modifies the delay cell illustrated in FIG. 5 by providing multiple paths between the tail current node 501 and the PMOS transistors 503 and 505 as shown in FIG. 10. In particular, the path between the PMOS loads 503 (or 505) and the tail current node 501 is subdivided into three separate paths 650 (or 650X), 651 (or 651X), and 652 (or 652X). Each of the three separate paths are further subdivided into 4 parts. Each path on one side of the differential circuit between the PMOS loads 503 and the tail current node 501 receives a separate voltage VIN1, VIN2, or VIN3. Each path on the other side of the differential circuit receives the corresponding complementary voltages VIN1X, VIN2X, or VIN3X. The voltages VIN1, VIN2, and VIN3 have phase separated by one or two delay stages and correspond to the different phases being received by the stages shown in FIG. 6A. In addition, each path receives its own set of select signals to provide interpolation capability between the paths. FIG. 11 shows additional details of path 652. Each of the four subdivided path includes a switch controlled by one of the select signals Sel 1*a*, 1*b*, 1*c*, and 1*d* and a transistor controlled by VIN1. Note that the transistors have to be sized appropriately to achieve the desired interpolation.

Figure 12:
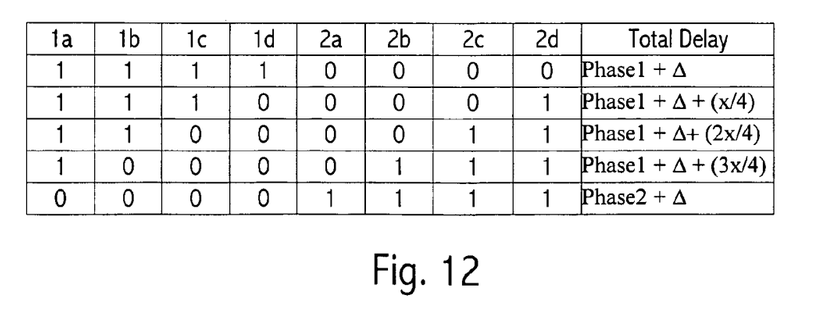
FIG. 12 illustrates a table showing operation of the embodiment in FIGS. 10 and 11.

FIG. 12 illustrates operation of the interpolation for the circuit shown in FIGS. 10 and 11. Assume two of the subdivided paths are 1*a*, 1*b*, 1*c* and 1*d* and 2*a*, 2*b*, 2*c*, and 2*d*. An exemplary truth table is provided in FIG. 12. Assume the voltage supplied at 652 VIN1 corresponds to phase1 and the voltage supplied at VIN2 corresponds to phase2. Let the delay between phase2 and phase1 be x or phase2-phase1=x. In the table in FIG. 12, a 1 in a column indicates that that path is turned on. Thus, when all the switches 1*a*, 1*b*, 1*c*, and 1*d* are turned on, and none of the switches 2*a*-2*d* are turned on, the total delay is phase 1+Δ, where Δ is the delay of the delay cell as described before. When switches 1*a*-1*c* are turned on and 2*d*, the delay is phase 1+Δ+x/4. The table illustrates the remaining allowed switch settings for interpolation between path 651 and 652. Note that there are restrictions on which paths can be activated at any one time. FIG. 12 illustrates allowed paths in one embodiment of the invention. The allowed paths are based on the sizing of the circuits in the paths and the expected phase difference between the paths so that the desired interpolation is achieved. In the illustrated embodiment in FIG. 10, interpolation is allowed between path 650 and 651, and 651 and 652.

The DLL may have to support a wide delay range under a wide range of process variations. In an embodiment, the maximum/minimum delay ratio of the delay line for the fast process is about 5 but the max/min delay ratio of the line for the slow process is greater than 20. The frequency of the reference clock (MEMCLK) may change during various chip functional modes. Furthermore the delay line could be providing a large delay, and then the DLL may be asked to lock to a much smaller delay. That could result in the DLL falsely locking to 540 degrees instead of 180 degrees.

For certain frequency jumps, the control logic, which may be located in the North Bridge, resets the counters used to achieving lock (see FIG. 2) and then uses a fast lock sequences so that the DLL can lock from the fastest setting in, e.g., 2 microseconds. For other frequency jumps, certain applications may require a lock time specification of 2 microseconds but that requirement may not be satisfied if the DLL relocked from the fastest setting, so a different fast lock sequence may be utilized. Certain fast lock sequences have a possibility of false lock. To avoid this, false lock detection and prevention logic 231 (see FIG. 2) may be utilized.

As described previously herein, the DLL attempts to lock to 180 degrees with respect to the reference clock. A positive edge of the reference clock is used in the delay line. The output of the delay line goes into the data input of the phase detector. The negative edge of the reference clock is used by the phase detector. When the delay line is locked, if the negative edge clocks the intermediate phases, they should all be high. The first phase and the ultimate phase can toggle between high/low due to not meeting setup/hold constraints. For margin reasons, the second and the penultimate phases are also ignored. Therefore the false lock detection logic looks at intermediate phases to determine whether the delay line is falsely locked.

Note that some embodiments of the delay line may provide for a programmable length of the delay line. For example, control bits may be used to select a delay line with 8, 12, or 16 delay stages providing respectively, 32, 48 or 64 possible output phases. Therefore, the intermediate bits to check may vary. For an 8-cell delay line, in addition to phase 8, which is used for the 180 degree lock, phases 3, 4, 5, 6 are also examined to determine a false lock condition. For a 12-cell delay line, in addition to phase 12, which is used for the 180 degree lock, phases 3, 4, 5, 6, 7, 8, 9, 10 are also examined to determine a false lock condition. For a 16-cell delay line, in addition to phase 16, which is used for the 180 degree lock, phases 3-14 are also examined to determine a false lock condition. When the delay line is close to lock, the intermediate phases will all be 1 when clocked. If the total delay is greater than 360 degrees, then some of these intermediate phases will be zero. When the false lock circuit detects that any of these intermediate phases are zero, it asserts a false lock signal indicating that a false lock condition may exist.

The phase detector provides two outputs: INC and DEC. Since false-locking happens when the delay line is going too slow, the delay line needs to be made to go faster. Therefore, when the false lock signal asserts, irrespective of whether the phase detector says INC or DEC, the counter keeps decrementing. Decrementing the counter makes the delay line go faster (assuming the filter is decremented sufficiently to affect the accumulator). The counter keeps decrementing until the false lock signal deasserts, which happens when all the intermediate phases are high when clocked.

In some embodiments it is desirable to operate the DDR2 interface at various transfer rates, e.g., 400, 533, 667 and 800 MT/s. Under certain circumstances a faster lock mode is desirable. The need for a faster lock mode can depend on the transfer rate and the change in reference clock speed when changing from one power mode to another power mode. In certain circumstances it may be acceptable to set the counter controlling the DAC at the fastest setting, all zeros in one embodiment, and adjust the counter to be slower until lock is achieved by incrementing or decrementing the least significant bit of the counter. However, under certain circumstances, for example, when going from a low power state to a high power state, the time available for the DLL to lock may be significantly less than at other times, e.g., at power up. Thus, one or more faster lock modes may be desirable.

Operation of fast lock modes is accomplished by causing the counter controlling the DAC to count with a larger increment (more coarsely) by updating an intermediate bit instead of the least significant bit (LSB). For example, assume the counter bits used to control the DAC are A [8:0]. In a normal lock mode the least significant bit (LSB) A[0] gets updated by the filter and the counter counts 0, 1, 2, 3, etc. Thus, the increment for the counter is 1. In one fast lock mode A[5] gets updated instead of the LSB and the counter counts in increments of 32, i.e., 0, 32, 64, 96, etc. until the counter is within 32 settings of where it needs to be to achieve lock. Once the DLL "locks" at the coarse value, the DLL proceeds to lock at a finer increment, by updating one of the bits less significant than A[5]. In some embodiments, the counter can go directly to the LSB as the increment. In other embodiments, the counter is configured to count with additional intermediate bit(s) until eventually the LSB is used as the increment. In another fast lock mode A[2] gets updated (increment of 4) until the counter is within four of its locked condition. Then A[0] is updated until lock is achieved. In one embodiment, accuracy requires that the counter value be within 1 setting of its ideal position. The number of clocks cycles that the DLL spends in the various fast lock modes depends on the initial frequency that it had locked to (the current counter setting) and the final frequency that it needs to which it needs to lock.

Note that as previously stated the DLL operates in open loop mode and periodically is placed in closed loop mode to recalibrate the DLL for temperature variations. In such circumstances, a normal lock approach may be used since the starting frequency at which the DLL is currently set and the ending frequency are going to be very close. The time it takes to lock in those circumstances is going to be relatively short and incrementing or decrementing by the LSB is appropriate.

In one embodiment, the time to relock is required to be under 2 microseconds. Under one of those frequency transitions, the data rate of the memory interface is going from 320 megatransfers (MT)/s to 600 MT/s, with a final cycle time of 3.34 ns. Note that the data rate is twice the frequency of the MEMCLK. In an embodiment, the reference clock supplied to the DLL is twice MEMCLK, which the DLL divides to generate MEMCLK, which is used to lock the loop. With a 16 cycle filter (5 bit filter 211 in FIG. 2), only 2000/3.34/16=37 corrections can be done to the DAC in 2 microseconds.

The main DAC has 16 steps but under these particular low-high transitions, it needs to go only 13 steps. Therefore 15 corrections can be allocated for correction with the increment set so the counter counts by 32. At the end of the coarse lock mode, the counter is offset from the correct setting by a maximum of 32 steps. Then, the DLL enters a finer grained mode in which the increment is set at 4. With this increment, 10 corrections are allocated. At the end of this lock mode with the increment at 4, the counter is offset from the correct setting by a maximum of 4 steps. Then the DLL enters normal single-correct mode where 12 corrections are allocated. Thus, lock can be achieved in 37 corrections.

Figure 13:
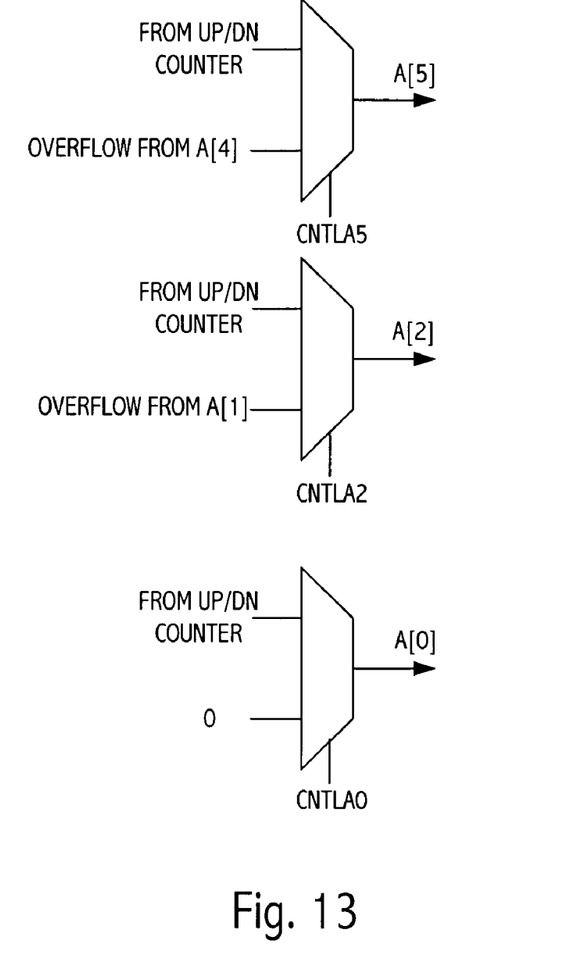
FIG. 13 illustrates multiplexers utilized to achieve fast lock modes.

Remember that in the embodiment shown in FIG. 2, the accumulator is a 9-bit counter. The increment/decrement pulses to this accumulator come from the digital filter. In one fast lock mode, the pulses from the filter do not update the LSB but update the 6th (A[5]) bit for an increment value of 32, the 3rd bit (A[2]) for an increment value of 4 and the LSB for regular mode. There are multiplexers (as shown in FIG. 13) before the 6th bit and the 3$^{rd}$ bit which select whether to directly take the increment/decrement pulses from the filter or to take the overflow pulses from the previous bit. Bit A[0] receives the output of the filter in regular lock mode and a 0 while one of the other bits is being updated in a fast lock mode.

An embodiment may provide for logic that detects overflow/underflow conditions. That can be used to prevent the DAC counter from switching from a fastest setting to a slowest setting and vice versa by rolling over. For an increment value of 32, bits 5-8 must saturate. For an increment value of 4, bits 2-8 must saturate. In regular mode, bits 0-8 must saturate. Therefore the saturation detection logic should be appropriately segmented to detect overflow/underflow for each of these saturation conditions.

The idea behind fast lock mode is to over-correct for a period of time to get close to the final locked state quicker and once the coarse lock is achieved, and therefore the final lock is close, revert back to single step correct mode for fine adjustments. In an embodiment control logic in the North-Bridge controls the lock sequence with 2 control bits. The first sequence shown in the table below includes three different states for the DLL. When the control bits are "11", the DLL spends 240 cycles in a coarse lock mode (where the increment in the accumulator is 32). With 240 cycles available, that allows the counter to start from 0 (its fastest setting). A simple state machine that counts the number of cycles can be used to determine when to change the control bits. After 240 cycles the control bits go to 01, a state providing an increment of four. After 160 cycles in that state, the control bits go to 00 allowing the counter to increment or decrement using the LSB until lock is achieved.

| FAST LOCK | Number of MEMCLK cycles | |
|---|---|---|
| CONTROL BITS[1:0] | Sequence 1 | Sequence 2 |
| 11 | 240 cycles | 80 cycles |
| 01 | 160 cycles | 160 cycles |
| 00 | remaining time up to 2 us | remaining time up to 2 us |

In a second sequence (Sequence 2) shown in the table, only 80 cycles are allocated when the control bits are 11 while the number of cycles are the same when /the control bits are 00 and 01. The shortened sequence of sequence 2 may be utilized when the difference between the current counter value and the value to which the counter has to lock is relatively small. However, the shortened sequence may allow false locks to occur. False locks can be detected be evaluating the intermediate phases as described above.

Figure 14:
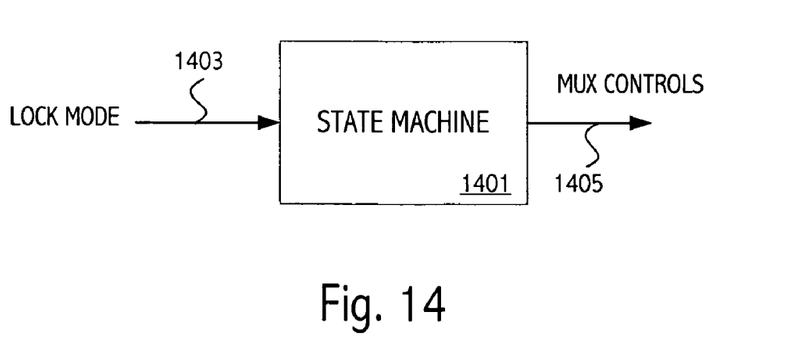
FIG. 14 is a high level block diagram of an embodiment of the control structure to implement the various lock modes.

Referring to FIG. 14, a high level block diagram illustrates an embodiment of the control structure that can be utilized to implement the various lock modes. The state machine 1401 receives an indication 1403 as to which lock mode to implement, e.g., sequence 1, sequence 2, or regular lock mode. Of course other fast lock modes may be implemented besides the specific examples described herein. The state machine 1401 may be implemented simply to count as described above to achieve the sequences specified by the various lock modes (e.g., sequence 1 and 2). The state machine provides 1401 provides appropriate control signals 1405 for the multiplexers shown in FIG. 13 to achieve, e.g., the sequences shown in the table above.

In an embodiment, the memory reference clock is generated from the North bridge clock by appropriate division. The North bridge could run the memory interface much slower than the possible peak data rate of the memory interface, depending on the speed of the NB reference clock, and the limitation of a minimum divisor ratio of 5. For example, in some low-power states, the NB clock runs at 0.8 GHz, which implies that the memory reference clock runs at 160 MHz or the data rate is 320 MT/s. This is true even if the peak data rate possible is 667 MT/s. For example, in an embodiment, for a peak data rate of 667 MT/s, transitions in the north bridge clock from 0.8-1.6 GHz and 0.8-1.8 GHz cause big enough frequency transitions in the memory reference clock to require sequence 1. Similarly, for a peak data rate of 800 MT/s, transitions in the north bridge clock from 0.8-1.6 GHz and 0.8-1.8 GHz cause big enough frequency transitions in the memory reference clock to require sequence 1.

Other, smaller changes in the reference clock can use sequence 2. Thus knowledge of the change in the frequency of the reference clock and the data rate on the memory can be used to select an appropriate locking scenario. The clock that is being transitioned is an internal clock in the North Bridge or processor that supplies the reference clock utilized in the memory interface.

Thus, various embodiments have been described for making and using delay locked loops. The description of the invention set forth herein is illustrative, and is not intended to limit the scope of the invention as set forth in the following claims. Other variations and modifications of the embodiments disclosed herein may be made based on the description set forth herein, without departing from the scope of the invention as set forth in the following claims.

What is claimed is:

1. A method of operating a delay line, comprising:
determining a count value in a counter according to comparisons of a reference signal supplied to the delay line and a feedback value generated by the delay line; and
determining an increment value for the counter according to a selected one of a plurality of lock modes, at least one of the lock modes being a fast lock mode causing the counter to count initially during locking with the increment value equal to a value of one of the intermediate bits of the counter and another of the lock modes causing the counter to count initially during locking with the increment value equal to the least significant bit of the counter.

2. The method as recited in claim 1 further comprising: converting the count value to an analog signal; and using the analog signal to control a delay through delay cells of the delay line.

3. The method as recited in claim 1 further comprising operating the counter for a predetermined length of time for each increment value in one or more of the lock modes.

4. The method as recited in claim 3 wherein the predetermined length of time varies for at least one increment value according to the programmable lock mode.

5. The method as recited in claim 1 further comprising, after coarse lock is achieved in the fast lock mode, finer lock is then achieved using a smaller increment value.

6. The method as recited in claim 1, further comprising converting operation of the delay line between a closed loop mode and an open loop mode of operation.

7. The method as recited in claim 6 wherein in the open loop mode an aperiodic signal is passed through the delay line and in closed loop mode the delay line locks to a periodic signal supplied instead of the aperiodic signal.

8. The method as recited in claim 6, comprising periodically closing the delay line to form a delay-locked loop to recalibrate the delay line.

9. The method as recited in claim 8 wherein the selected lock mode for the periodic closing of the delay line utilizes a least significant bit of the counter as an initial increment value.

10. The method as recited in claim 1 wherein the programmable lock mode is set to a faster locking mode using one of the intermediate bits initially as the increment value according to a size of a change in frequency occurring for a clock signal from which the reference clock signal is generated.

11. The method as recited in claim 1 further comprising detecting a false lock condition when a faster lock mode is utilized.

12. A delay-locked loop circuit comprising:
a delay line circuit having a controllable delay;
a phase detector circuit coupled to compare a reference signal with a feedback signal of the delay line circuit and supply one or more signals indicative of the comparison; and
a counter coupled to the one or more signals from the phase detector circuit, the controllable delay being determined according to a count value of the counter, an initial increment value for the counter while locking to the reference signal being determined according to which lock mode of a plurality of lock modes is selected.

13. The delay-locked loop circuit as recited in claim 12 wherein a length of time that the counter utilizes the initial increment value varies according to the lock mode selected.

14. The delay-locked loop circuit as recited in claim 12 wherein the delay line circuit is configurable to be operable in an open loop mode of operation and a closed loop mode of operation in which the delay line is configured as the delay-locked loop.

15. The delay-locked loop circuit as recited in claim 12 further comprising a filter coupled between the counter and the phase detector, the filter comprising a second counter coupled to count up or down according to the one or more signals from the phase detector circuit, and wherein the counter is responsive to count up or down according to each overflow or underflow of the second counter in the filter.

16. The delay-locked loop circuit as recited in claim 12, wherein the initial increment value is selected to be one of an intermediate bit of the counter and the least significant bit of the counter.

17. The delay-locked loop circuit as recited in claim 16 wherein the initial increment value is determined, at least in part, according to a magnitude of a change in frequency occurring for a clock signal from which the reference clock signal is generated.

18. The delay-locked loop circuit as recited in claim 12 wherein in the delay-locked loop circuit is disposed in a memory controller.

19. A delay-locked loop circuit comprising:
a delay line circuit having a controllable delay;
a phase detector circuit coupled to compare a reference signal with a feedback signal of the delay line circuit and supply one or more signals indicative of the comparison;
a counter circuit coupled to the one or more signals from the phase detector circuit, the controllable delay being determined according to a count value of the counter circuit, an initial increment value for the counter while the delay-locked loop circuit is locking to the reference signal, being determined according to which lock mode of a plurality of lock modes is selected; and
a false lock detection circuit coupled to determine a false lock condition according to values of intermediate phases of the delay line.

20. An apparatus comprising:
a phase detector;
an accumulator responsive to count up or down according to phase information generated by the phase detector;
a delay line circuit coupled to form a delay locked loop operable in a plurality lock modes, an increment value at which the accumulator initially counts while the delay locked loop is trying to lock to a reference signal, being determined according to a particular lock mode utilized; and a digital to analog converter coupled to the accumulator and operable to generate an analog signal based on a count value of the accumulator to control a delay through the delay line circuit.

21. The apparatus as recited in claim 20 wherein the plurality of lock modes includes a fast lock mode causing the counter to count initially during locking using an increment value equal to a value of one of the intermediate bits of the counter and another of the lock modes causing the counter to count initially during locking using an increment value equal to the least significant bit of the counter.

22. The apparatus as recited in claim 12 further comprising a digital to analog converter coupled to the counter and the controllable delay line, the digital to analog converter configured to supply to the delay line an analog value corresponding to the count value to adjust the delay of the delay line.

* * * * *

UNITED STATES PATENT AND TRADEMARK OFFICE
CERTIFICATE OF CORRECTION

PATENT NO. : 7,271,634 B1 Page 1 of 1
APPLICATION NO. : 11/286454
DATED : September 18, 2007
INVENTOR(S) : Anand Daga, Philip E. Madrid and Sanjay Sethi It is certified that error appears in the above-identified patent and that said Letters Patent is hereby corrected as shown below:

Col. 14, line 42, please replace "wherein in the" with --wherein the--
Col. 14, line 66, please replace "plurality lock" with --plurality of lock--

Signed and Sealed this

Twenty Second Day of April, 2008

JON W. DUDAS
*Director of the United States Patent and Trademark Office*